United States Patent
Akram

[11] Patent Number: 6,144,101
[45] Date of Patent: *Nov. 7, 2000

[54] FLIP CHIP DOWN-BOND: METHOD AND APPARATUS

[75] Inventor: Salman Akram, Boise, Id.

[73] Assignee: Micron Technology, Inc., Boise, Id.

[*] Notice: This patent issued on a continued prosecution application filed under 37 CFR 1.53(d), and is subject to the twenty year patent term provisions of 35 U.S.C. 154(a)(2).

[21] Appl. No.: 08/758,931

[22] Filed: Dec. 3, 1996

[51] Int. Cl.[7] .......................... H01L 23/48; H01L 23/52; H01L 29/40
[52] U.S. Cl. .......................... 257/778; 257/707; 257/776
[58] Field of Search ..................... 257/778, 780, 257/781, 782, 706, 707, 797, 726, 718, 719, 698, 776

[56] References Cited

U.S. PATENT DOCUMENTS

| | | |
|---|---|---|
| 5,120,678 | 6/1992 | Moore et al. . |
| 5,311,059 | 5/1994 | Banerji et al. . |
| 5,677,575 | 10/1997 | Maeta et al. . |
| 5,786,230 | 7/1998 | Anderson et al. . |
| 5,915,170 | 6/1999 | Raab et al. . |

FOREIGN PATENT DOCUMENTS

| | | | |
|---|---|---|---|
| 5-166949 | 7/1993 | Japan | 257/797 |
| 5-235191 | 9/1993 | Japan | 257/797 |

*Primary Examiner*—Sheila V. Clark
*Attorney, Agent, or Firm*—Trask Britt

[57] ABSTRACT

A flip-chip semiconductor device comprises a carrier substrate having a conductor pattern on at least one side, and at least one semiconductor die with an active surface and an opposed ground surface. A conductive backing plate is conductively bonded to the ground surface. The active surface faces and is electrically connected to the conductor pattern of the carrier substrate. A conductive down-bond connection is provided between the backing plate and a ground connection or reference potential connection. The backing plate is preferably rigid and can be manipulated for indirect alignment of the die or dice carried thereon relative to the substrate.

34 Claims, 4 Drawing Sheets

FLIP CHIP DOWN-BOND: METHOD AND APPARATUS

BACKGROUND OF THE INVENTION

1. Field of the Invention

This invention relates generally to semiconductor chips mounted to carrier substrates. More particularly, this invention pertains to apparatus and methods for providing a down-bond for flip-chip technology or, stated another way, for providing an electrical connection between the back side of a semiconductor die which has been face-down electrically connected to traces on a carrier substrate.

2. State of the Art

There are a number of reasons for providing a ground connection between the back side of a semiconductor die or chip and circuitry on a carrier substrate to which the active side of the die is electrically connected. Such a connection provides a threshold potential very useful for characterizing the die, and enables access from the substrate to the die for controlling the die characteristics or for trouble-shooting of the die.

A relatively recent innovation in semiconductor chip technology is the flip-chip, a packaging configuration in which contacts on the active surface of an integrated circuit die are bonded directly to conductive traces of an insulated carrier substrate by, e.g., solder bumps, conductive epoxy or conductor filled epoxy. The advantages of the flip-chip connection when properly executed may include an increase in production volume, device reliability and improved device performance at reduced cost in comparison to leadframe mounted, transfer-molded dice or even bare die barebonded to a carrier substrate and having wire bonds extending to the substrate traces. Automated production is enhanced in comparison to wire-bonded dice because all active connections between each die and carrier substrate may be made simultaneously. This advantage is particularly significant in multi-chip modules (MCMs) employing a large number of dice on a single carrier substrate, examples of such devices including without limitation single in-line memory modules (SIMMs) and dual in-line memory modules (DIMMs), as well as multi-chip printed circuit boards (PCBs) carrying processor, memory, logic and other dice in combination.

However, providing a connection between the ground plane of the flip-chip and the substrate ground is made more difficult, because the flip-chip ground plane faces away from the substrate. Thus, conventional placement of a down-bond requires an additional time-consuming operation.

Because of the miniature scale of such chips and the relatively fragile circuit connections thereon, extreme care must be taken to avoid breakage or non-connection of required electrical circuits, whether formed of wire, solder bumps, conductive epoxy, TAB leads, laser pantography formed wires, or other means. Physical handling of such small chips and the component parts thereof presents significant problems. For forming very large scale integrated (VLSI) circuits incorporating a large number of circuits in a chip requiring many connections, alignment of the chip with a carrier substrate may be extremely difficult, particularly with the minute conductive flip-chip bumps and fine pitch (spacing) therebetween employed with increasing frequency. In addition, the back side of each chip must be separately connected to the substrate to establish a ground or reference potential.

In U.S. Pat. No. 5,311,059 of Banerji et al., a backplane grounded flip-chip integrated circuit die is disclosed in which a continuous film or coating of an electrically conductive material is applied to the back side of the flip-chip die and over concave peripheral fillets of an insulative underfill material disposed between the active surface of the chips and the carrier substrate, the surface of the substrate, and the ground connection (terminal) of the substrate. The technique does not address the problems encountered in handling chips without damage, or the difficulties encountered in precisely aligning conductively-bumped chips for face-down joining to the substrate conductors. Furthermore, Banerji does not provide any technique for simultaneously handling, aligning and bonding multiple flip-chip dice or of making a single, common ground or reference connection to the substrate for more than one die.

SUMMARY OF THE INVENTION

According to the invention, a flip-chip semiconductor device is provided in which a discrete conductive backing plate is superimposed on and conductively bonded to the back side of a flip-chip integrated circuit (IC) die. The flip-chip die has a front side with an active surface which faces and is electrically joined by an array of conductivity-bumped bond pads to a cooperative, matching (mirror image) metallization pattern or conductive traces on a carrier substrate such as a PCB. The opposing or back side of the flip-chip die typically comprises a common ground or other circuit which is also to be electrically bonded to one or more conductors carried by the substrate. A down-bond electrically connecting the back side of the die through the conductive backing plate with the substrate conductor completes the desired ground circuit, reference potential circuit, test circuit or other desired circuit.

The invention may be applied at the single die, multiple die, and wafer-scale level. For example, all the dice of a single-in-line memory module (SIMM) may be backed by a single conductive backing plate which is connected to the board by a single down-bond to provide the reference potential or ground.

As noted above, the active surface of each flip-chip die is typically connected to the substrate by reflowed solder bumps, heat-cured conductive or conductor-filled epoxy, and the like. Such electrical connections may also be made using a Z-axis anisotropic conductive adhesive film or tape, or even by a tape automated bonding (TAB) connection, wherein a dielectric film carries conductive traces. The backing plate and down-bond of the invention are useful irrespective of the type of flip-chip active surface connections employed.

In a preferred embodiment, the back side of the die or dice are precisely aligned with an conductively bonded to the backing plate prior to connecting each die by its face-down active surface to the substrate. The backing plate may then be used for physical manipulation, e.g. as an alignment and support fixture for the die or dice relative to and for alignment with conductors on a substrate such as a PCB or other higher-level package.

The down-bond of the invention may be provided in a variety of ways, e.g. a wire bond, TAB connection, conductive or conductor-filled adhesives, or the connection may be fabricated integrally with the backing plate so that only a single connection need be made to effect the down-bond.

In the following discussion, the term "carrier substrate" refers to a circuit board, package or other means for structurally supporting and/or electrically connecting an integrated circuit die to other dice to other components, or to external electrical connections. The substrate may be, e.g., a printed circuit board formed of paper-phenolic, FR-4, CEM, reinforced polyimide or polyester, ceramic or fluoropolymeric material, or molybdenum.

The term "integrated circuit" or "IC", refers to an active miniaturized electrical circuit which may include transistors, diodes, resistors, capacitors and/or other electrical components formed on or in a layer of semiconductor material such as silicon or gallium arsenide and accessed by inputs/outputs typically called "bond pads."The above-mentioned and other features and advantages of the invention will be readily understood by reading the following description in conjunction with the accompanying figures of the drawings, wherein like reference numerals have been applied to designate like elements throughout the several views.

DESCRIPTION OF THE PREFERRED EMBODIMENTS

Figure 1:
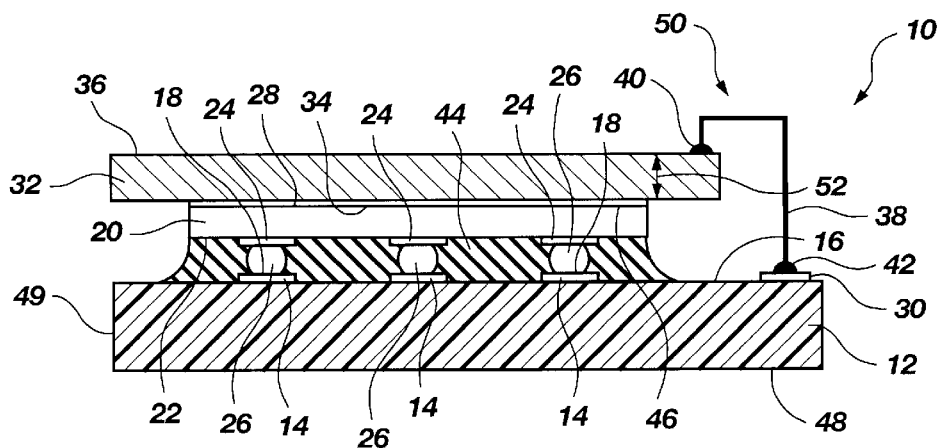
FIG. 1 is a cross-sectional view of a first preferred embodiment of a semiconductor device according to the present invention including with a flip-chip mounted to a substrate and back-bonded to a conductive backing plate and including a down-bond connection.

With reference to the drawings, and particularly to FIG. 1, a first embodiment of a flip-chip semiconductor device 10 is shown. The views are enlarged, and some dimensions of components shown in the drawings are further exaggerated for enhanced visualization.

A carrier substrate 12 is pictured with a metallized conductor pattern 14 on at least a first side 16, and including input/output connection surfaces 18. A flip-chip semiconductor die 20 has an active surface 22 shown with input/output (I/O) or "bond" pads 24 facing the carrier substrate 12. I/O connection surfaces or terminals 18 of conductor pattern 14 are shown connected to I/O pads 24 by solder or other conductive bumps 26 to electrically connect the circuits of the flip-chip semiconductor die 20 to the matching metailization or conductor pattern 14 on the carrier substrate 12 and to physically secure the flip-chip semiconductor die 20 to the carrier substrate 12.

Following connection of the die active surface 22 to the metallization or conduction pattern 14 of the carrier substrate 12, the space between the flip-chip semiconductor die 20 and the substrate 12, i.e. surrounding solder bumps 26 is typically (although optionally) filled with a nonconductive polymeric material 44, as known in the art, to mutually isolate the conductive connections, protect the active die surface from environmental effects (dust, moisture, etc.) and assist in mechanically strengthening and joining the die to the substrate. The polymeric material 44 is typically an epoxy curable by heat or radiation, although other suitable materials are known in the art.

The opposed surface, i.e. back side 28 of flip-chip semiconductor die 20 is advantageously connected through a conductive backing plate 32 and a down-bond connection 50 to a ground or reference potential connection 30 on the carrier substrate 12 to complete what is herein noted as a second circuit. As shown in FIG. 1, a first side 34 of an electrically conductive backing plate 32 is bonded to the die back side 28, typically defined as a "non-active" ground side or ground plane of the flip-chip semiconductor die 20. A second side 36, opposed to the first side 34 of the backing plate 32, is electrically connected to substrate connection 30 by a down-bond connection 50 shown as comprising wire 38 and wire bonds 40 and 42. The wire 38 may be of gold, silver, aluminum, or alloys thereof, all as known in the art.

The backing plate 32 is preferably formed of a conductive metal sheet or other material which has a high electrical conductivity useful for a ground circuit or reference potential circuit. Thus, the backing plate 32 may comprise aluminum, silver, gold, copper or other metal or alloys thereof. Backing plate 32 may also comprise an insulative or dielectric substrate of any material typically employed in carrier substrates and carrying a continuous sheet or a pattern of such a conductive material thereon. Finally, the backing plate 32 can also be made of a semiconductor such as silicon. The plate-to-die bond 46 may comprise a conductive adhesive such as metal filled epoxy, including as an example, a silver-filled epoxy commonly used for die-attach to paddle-type lead frames, a conductor-filled urethane, metallic solder paste or even a Z-axis anisotropic conductive adhesive film, all as known in the art. The back side 28 of flip-chip semiconductor die 20 may be pre-coated with a conductive film at the wafer level to enhance the electrical connection and mechanical bond, by any process known in the art including CVD, PECVD, sputtering, printing, etc.

The backing plate 32 may be coextensive with the back side 28 of flip-chip semiconductor die 20, or may be somewhat larger or smaller than the back side 28. Preferably, the backing plate 32 at least overcovers the entire back side 28 of each flip-chip semiconductor die 20 to which it is bonded, and most preferably extends laterally beyond the die periphery, as shown.

In a preferred embodiment, the flip-chip semiconductor dice 20 are aligned, precisely placed and back-bonded to the backing plate 32 prior to forming the die-to-substrate flip-chip connections. The backing plate 32 may then be directly manipulated by handling equipment to indirectly control the positioning and alignment of the flip-chip semiconductor dice 20 in a subsequent processing operation to effect connections to carrier substrates or other higher-level packaging.

The second, i.e. reverse side 48 of the carrier substrate 12 or an edge 49 thereof may include circuit connections, not shown, for interconnection with a higher-level package, another PCB and/or other circuit components, e.g., on another PCB such as a motherboard.

Figure 2:
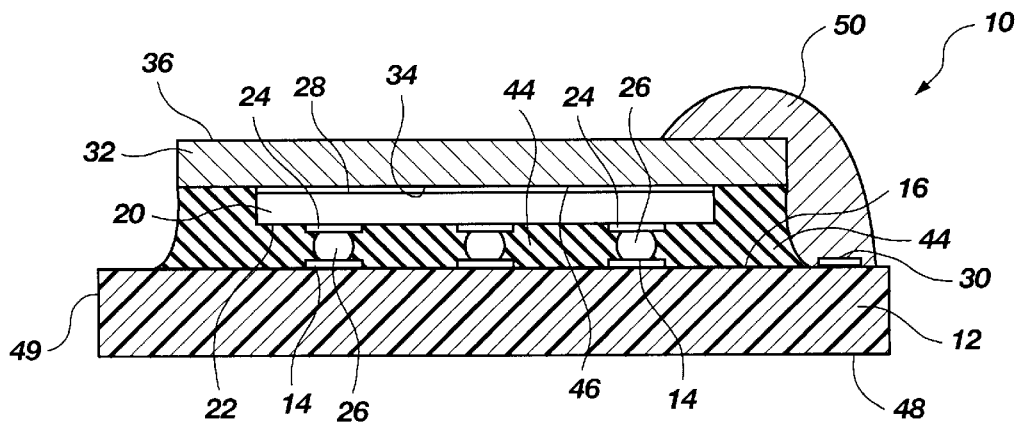
FIG. 2 is a cross-sectional view of a second preferred embodiment of a semiconductor device according to the invention including a flip-chip mounted to a substrate and back-bonded to a conductive backing plate and including a down-bond connection.

Turning now to FIG. 2, a single flip-chip semiconductor die 20 is shown connected to a carrier substrate 12 as in FIG. 1, with a conductive backing plate 32 connected to the back side 28 of the die. In this embodiment, the down-bond 50 comprises a body of conductive material or conductor-containing material which may be applied as a viscous fluid or gel and thereafter hardened or otherwise cured to a stable dimensional state. The conductive down-bond 50 may comprise e.g. a metallic solder, metal-filled polymer such as the aforementioned silver epoxy adhesive, or other conductive material. The conductive down-bond 50 forms an electrical connection between the second side 36 of the backing plate 32 and the ground or reference potential connection 30 on the carrier substrate 12.

Figure 3:
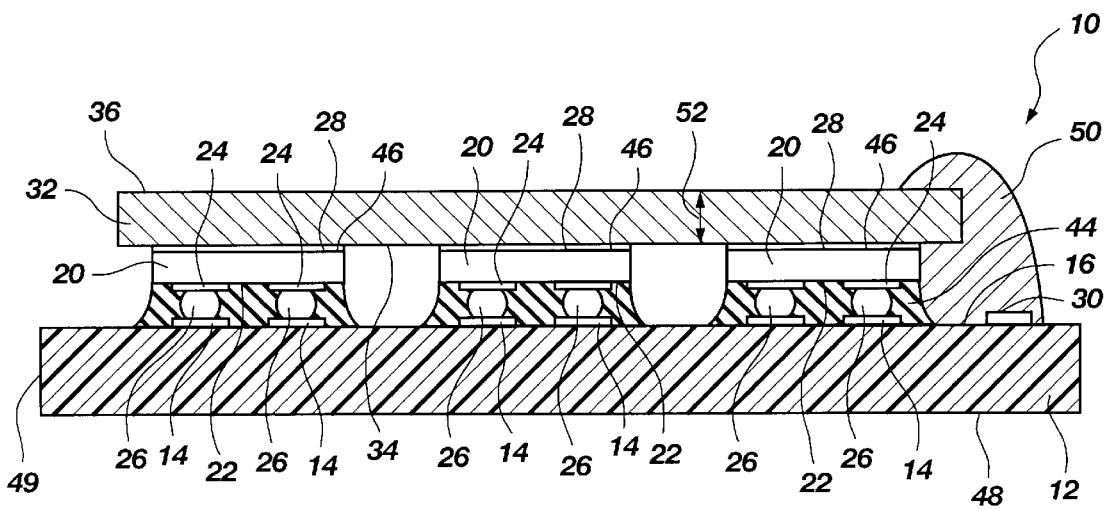
FIG. 3 is a cross-sectional view of a third preferred embodiment of a semiconductor device of the invention including multiple flip-chip dice mounted on a substrate and back-bonded to a single discrete conductive backing plate electrically connected to the substrate by a down-bond of the invention.

FIG. 3 illustrates the invention as applied to a flip-chip semiconductor device 10 formed of multiple flip-chip semiconductor dice 20. A single backing plate 32 is bonded to the back side 28 of the multiple flip-chip semiconductor dice 20, and a single down-bond connection 50 between the second side 36 of the backing plate 32 and the carrier substrate 12 provides the ground or reference potential circuit for all of the dice. The down-bond connection 50 is illustrated as comparable to that of FIG. 2, although any other type of suitable connection may be employed.

Figure 9:
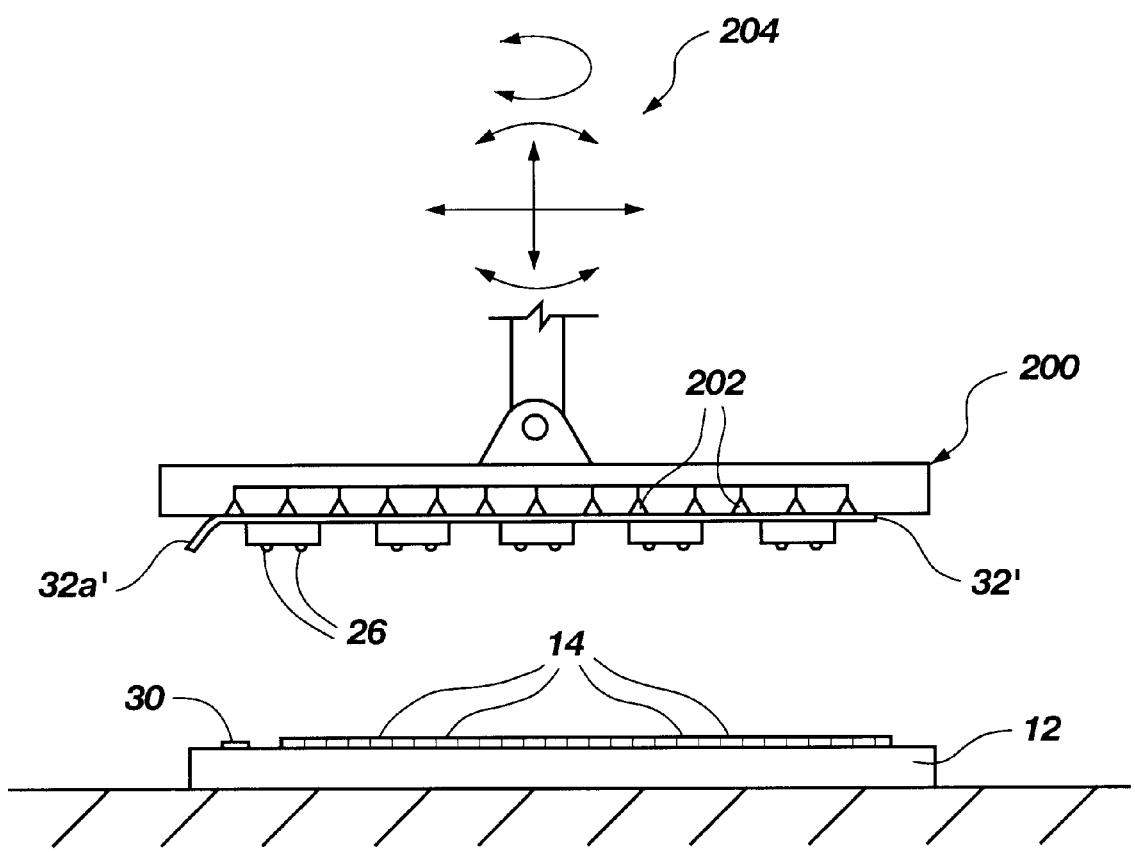
FIG. 9 is a schematic side view of a flexible-film backing plate embodiment of the invention being manipulated by a vacuum chuck.

The backing plate 32 is preferably rigid for supporting a plurality of attached multiple flip-chip semiconductor dice 20. The backing plate 32, as well as the back sides 28 of the multiple flip-chip semiconductor dice 20, may be provided with precise dimensions or machine recognizable fiducial marks such that a large number of multiple flip-chip semiconductor dice 20 may be accurately aligned and supported on a single backing plate and the plate in turn accurately aligned with a carrier substrate. Toward this end, a pattern recognition system such as employed in the industry, typically for automated flip-chip aligner-bonders, may be employed in handling the dice and backing plate. The die active surfaces 22 of the plate-mounted semiconductor dice 20 may thus be accurately aligned as a group to correspond to mating metallization or conductor patterns 14 on the carrier substrate 12. Manipulative control of the backing plate 32 with attached multiple flip-chip semiconductor dice 20 permits a large number of die-to-substrate flip-chip connections to be made more accurately and in a single step per substrate. The thickness 52 of backing plate 32 may vary widely, but (if a metal sheet) typically is about 3 to about 100 mils for rigidity without undue thickness. In general, the minimum value of plate thickness 52 for rigidity is a function of overall plate size. Rigidity is also a function of the material used. For supporting a large number of dice, a backing plate 32 of greater bending resistance is required. Of course, if rigidity is not required, backing plate 32 may be made extremely thin. To achieve precise die and backing plate alignment and afford good handling characteristics of the bonded dice and plate equivalent to that provided by a rigid backing plate, it is contemplated (see FIG. 9) that a metal film-type plate 32' (thickness exaggerated for clarity) may be held by vacuum ports 202 on a planar-surfaced vacuum chuck 200 for bonding of flip-chip semiconductor dice 20 thereto, and the vacuum chuck 200 used to manipulate (see arrows 204) the dice/plate assembly for flip-chip bonding to the carrier substrate 12, after which the film 32' is released and an integral portion 32a' of the film configured as a lead may be bonded to a substrate connection 30 by conductive adhesive, thermocompression bonding, or other means known in the art.

As shown in FIG. 3, the backing plate 32 overcovers the flip-chip semiconductor dice 20 and thus also acts as a protective layer against physical damage to the flip-chip semiconductor dice 20 during handling. Backing plates 32 may also be used to support and safely store preplaced flip-chip semiconductor dice 20 awaiting incorporation in an MCM. For example, dice/plate assemblies might be vertically stored in racks until needed to complete an MCM.

In addition, the backing plate 32 to which the flip-chip semiconductor dice 20 are joined acts as a heat sink to assist in protecting the dice from heat-induced damage during subsequent thermal bonding processes, and assists in cooling of the device during operation.

Further, the entire backing plate 32, when connected by a down-bond connection 50, is at a uniform potential, and thus provides an enlarged upper surface easily accessed by test probes.

Figure 4:
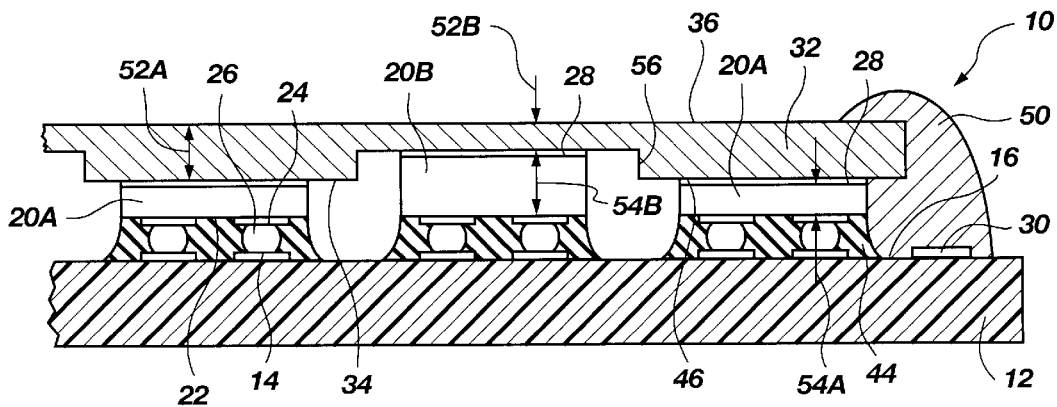
FIG. 4 is a cross-sectional view of a fourth preferred embodiment of a semiconductor device of the invention with multiple flip-chip dice of differing thicknesses mounted on a substrate and back-bonded to a single conductive backing plate having recesses formed therein for accommodating thicker dice to provide a common alignment face plane for all of the dice.

As shown in FIG. 4, a flip-chip semiconductor device 10 has a backing plate 32 which accommodates flip-chip semiconductor dice 20 of differing thicknesses in the same device. As illustrated, the thickness 54B of flip-chip semiconductor die 20B is greater than the thickness 54A of flip-chip semiconductor die 20A. A portion 56 of the first side 34 of the backing plate 32 is formed with a recess 56 to accommodate the thicker flip-chip semiconductor die 20B. The backing plate 32 has a reduced thickness 52B over the recess 56 in comparison to the thickness 52A adjacent flip-chip semiconductor die 20A. Use of the recesses 56 enable the die active surfaces 22 of all flip-chip semiconductor dice 20A, 20B, etc. to be aligned in a substantially coplanar manner. The backing plate 32 may be manipulated by automated machine to align all mounted dice flip-chip semiconductor 20 with the conductor pattern 14 and make all flip-chip electrical bonds therebetween simultaneously.

Figure 5:
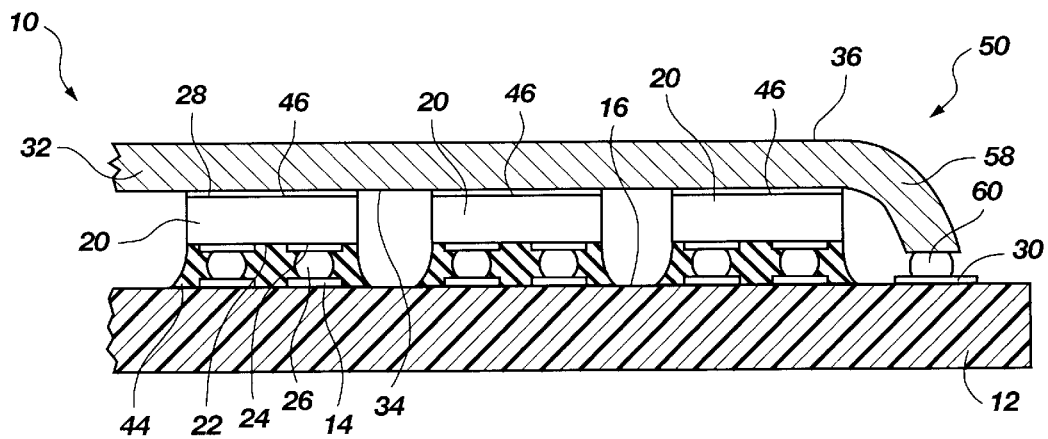
FIG. 5 is a cross-sectional view of a semiconductor device with multiple flip-chip dice mounted on a substrate and back-bonded to a single backing plate with integral extension electrically connected to the substrate.

FIG. 5 shows another embodiment of flip-chip semiconductor device 10 of the invention, wherein the backing plate 32 is formed with an integral extension 58 which is directed downwardly toward the ground connection 30 on the substrate. The down-bond connection 50 requires only a single bond 60 (between the extension 58 and the ground connection 30) for completion of the electrical ground or reference potential circuit for all of the flip-chip semiconductor dice 20 connected to the backing plate 32. Thus, use of the conductive backing plate 32 eliminates the need to provide a separate ground or reference potential connection 50 for each flip-chip semiconductor die 20. Furthermore, the back sides 28 of flip-chip semiconductor dice 20 may be bonded to the first side 34 of the backing plate 32 with plate-to-die bonds 46 of conductive adhesive, and the single bond 60 may then be made simultaneously with the bonds between the input/output pads 24 of the die active surfaces 22 and conductor pattern 14, eliminating a further step. As already indicated, the bumps 26 as well as single bond 60, may comprise solder or a conductive polymeric material.

Alternatively, the electrical connections between the backing plate 32 and the conductor pattern 14 of the carrier substrate 12 may be a conductive lead or leads of a TAB process. The backing plate 32 is preferably formed of a conductive metal, a metal alloy, or an insulated, rigid substrate (of any typical PCB material) faced on one or both sides with a metal sheet or film.

FIGS. 1–5 illustrate the die-to-substrate electrical connections as reflowed solder bumps 26, as known in the art. As noted previously, these connections may alternatively be made with e.g. conductive polymer such as a conductive epoxy or metal-filed epoxy, which is then cured.

In some cases, the connections may be made with a conductive two-part polymeric material which is chemically self-curing at ambient temperatures. However, any useful electrical connection means may be used, including the aforementioned Z-axis anisotropic conductive adhesive film or tape.

Figure 6:
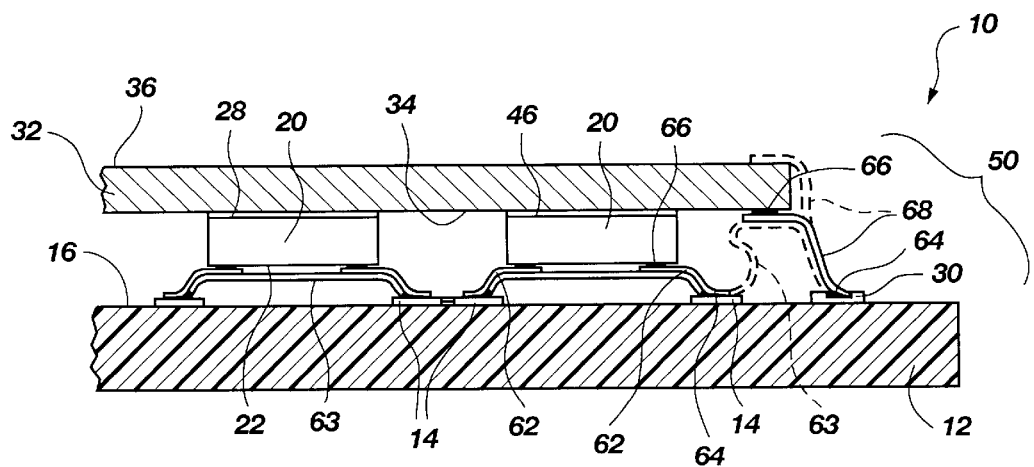
FIG. 6 is a cross-sectional view of a semiconductor device with flip-chip dice mounted on a substrate by tape automated bonding, and back-bonded to a backing plate with a down-bond provided by a TAB connection.

As depicted in FIG. 6, a multiple die flip-chip semiconductor device 10 includes a carrier substrate 10 having a metallization or conductor pattern 14 on side 16. In this figure, the formation of electrical bonds to a large scale flip-chip device by tape automated bonding is illustrated.

Figure 6A:
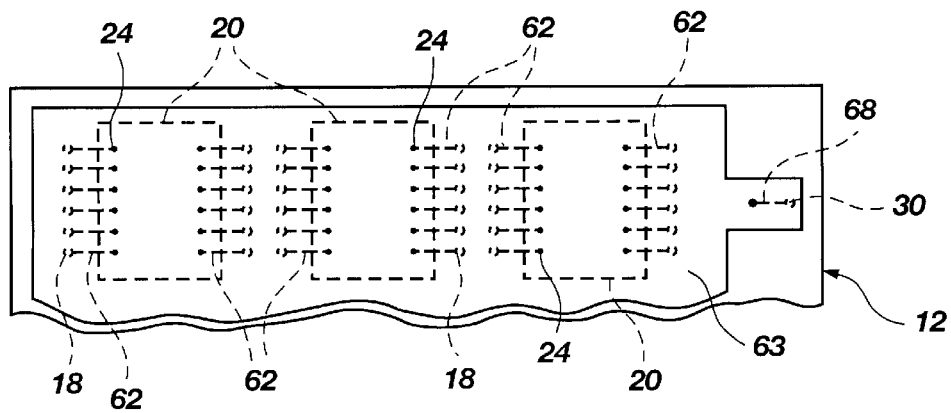
FIG. 6A is a top elevation of a lead pattern extending from a bond pad array to terminals of a conductor pattern on a carrier substrate.

A plurality of flip-chip dice 20 have their active surfaces 22 facing the substrate 12 and have leads 62 carried on a dielectric film 63 and attached by a conductive adhesive 66 (or alternatively by thermocompression bonding) in a tape automated bonding (TAB) process to bond pads on their die active surfaces 22. The leads 62 are attached to the conductor pattern 14 by solder or conductive polymeric material 64, or by other means known in the art. While leads 62 have been shown in a vertically elongated position for clarity, it will be understood that ordinarily they would be substantially planar and lying close between the carrier substrate 12 and flip-chip semiconductor dice 20. A backing plate 32 covers the flip-chip semiconductor dice 20 of the device 10; the dice are bonded to the first side 34 of the backing plate at plate-to-die bonds 46 of conductive material. The figure further shows a "down-bond" connection 50 comprising a lead 68 which is bonded by conductive adhesive or solder 66 to the first side 34 or second side 36 (broken lines) of the backing plate. The lead 68 is also bonded to a ground connection 30 on the carrier substrate 12 e.g. by solder or conductive polymeric material 32 to complete a second circuit, e.g. a ground or reference potential circuit. The lead 68 may comprise a discrete, self-supporting metal lead or a metal film carried on a polyimide or other dielectric film as employed in TAB processes. The configuration of FIG. 6 may have special utility in a situation where the bond pad pattern of a flip-chip semiconductor die 20 and the conductor pattern 14 of the carrier substrate 12 do not match. In such case, the TAB leads may be used as an adapter or bridge between the bond pads and the terminal ends of the conductor pattern 14. FIG. 6A is a top elevation of an exemplary pattern of leads 62 carried on dielectric film 63 and extending between an array of bond pads 24 and their associated I/O terminal surfaces 18 of conductive pattern 14. The locations of flip-chip semiconductor dice 20 are shown superimposed in broken lines.

The lead or TAB connection may be used for the down-bond connection 50 regardless of the type of electrical bonding between the flip-chip semiconductor dice 20 and the carrier substrate 12. Lead 68 may be attached to the backing plate 32 prior to or following attachment of TAB leads 62 to the flip-chip semiconductor dice 20 or at the same time if (as shown in broken lines) dielectric film 63 also carries lead 68.

Figure 7:
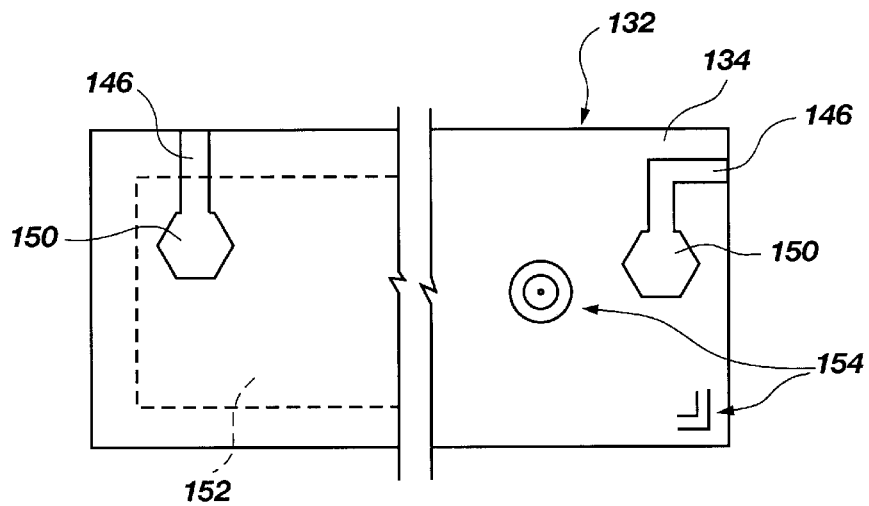
FIG. 7 is a top elevation of a multi-die backing plate according to the present invention including fiducial marks on the upper surface thereof.
Figure 8:
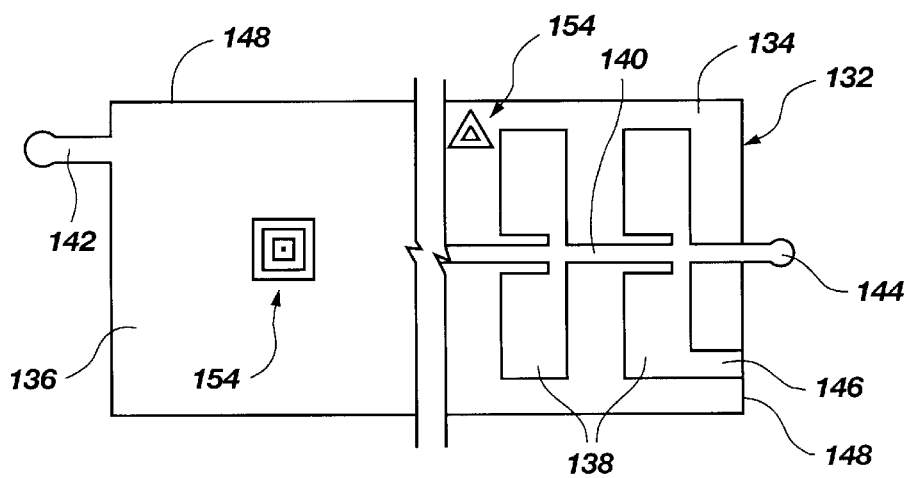
FIG. 8 is a bottom elevation of the backing plate of FIG. 7.

FIGS. 7 and 8 depict an embodiment of a backing plate 132 wherein a dielectric plate substrate 134 is employed, the dielectric comprising any suitable material including those previously mentioned herein for carrier substrates, and further including silicon having an oxidized or nitrided surface between the core of the substrate and metal sheet 136 carried on one surface thereof. Metal sheet 136 may cover dielectric plate substrate 134 as shown on the left-hand side of FIG. 8, or comprise a pattern of conductive die-attach pads 138 linked by connective traces 140, as shown on the right-hand side of the figure. In either case, an integral extension such as 142 or 144 of the metal of the sheet may be employed to form the reference, ground or test connection between backing plate 132 (and the die carried thereon) and a carrier substrate conductor. Further, another integral portion 146 of sheet 136 may wrap around an edge 148 of dielectric plate substrate 134 to provide a test pad 150 for probing by test equipment. In addition, dielectric plate 134 may include a thermally-conductive core 152 to enhance heat transfer from the flip-chip semiconductor dice 20 mounted to the plate 132. Finally, precisely-placed fiducial marks 154 may be placed on at least one and preferably both sides of backing plate 132 (or any other backing plate 32) as previously described to promote precise relative alignment of the backing plate 132 and flip-chip semiconductor dice 20 for mutual bonding thereof, and of the plate/die assembly with the conductive pattern of a carrier substrate.

The major benefits of attaching a backing plate 32 (or 132) to the flip-chip semiconductor die or dice 20 are evident.

First, the flip-chip semiconductor die or dice 20 may be first bonded to the backing plate 32. The dice may then be manipulated through the die-to-substrate attachment steps by control of the backing plate, making alignment and bonding of the dice to the substrate faster, easier, and with more precision. The method is especially advantageous for the manufacture of multiple-die devices such as MCMs and including even wafer scale assemblies having several thousands of integrated circuit dice.

Second, the backplate may provide a hard, rigid protective cover over the flip-chip semiconductor flip-chip semiconductor device to prevent damage to the assembled device 10, including the relatively fragile active surface electrical connections.

Third, the need for separate grounding or reference potential connections between each flip-chip semiconductor die 20 of a multiple-die device and the carrier substrate 12 is eliminated. A single down-bond connection 50 may be used, saving time and expense.

Fourth, a large second side 36 is provided for contact with a test probe.

Fifth, the backing plate 32 can act as a heat sink to prevent overheating of the dice, electrical connections and substrate during fabrication and operation.

Sixth, the method may be used with many types of die-to-substrate bonds, and in some cases the plate-to-substrate down-bond connection 50 may be made simultaneously with the die-to-substrate flip-chip bonds.

Seventh, the down-bond connection 50 may be a wire, a body of conductive or conductor-containing polymeric material, an integral extension of the backing plate 32, a discrete lead or a metal-on-film lead applied by a TAB process, or any other type conductive connection which will provide the necessary electrical connection.

The method is useful whether the down-bond connection 50 is used to establish a grounding circuit, reference potential circuit or other type of circuit.

It is anticipated that various changes and modifications may be made in the construction, arrangement, operation and method of construction of the disclosed herein without departing from the spirit and scope of the invention as defined in the following claims.

What is claimed is:

1. A semiconductor device, comprising:
   a carrier substrate having a pattern of conductors on at least a first surface;
   at least one semiconductor die having an active surface on a first side and a second surface on an opposed second side, said active surface comprising an integrated circuit and configured to face said carrier substrate first surface for electrical connection to conductors of said pattern, said second surface of said at least one semiconductor die being adapted to receive a voltage level applied to said semiconductor die;
   a substantially rigid, electrically conductive backing plate immovably affixed and conductively bonded to the second surface of said at least one semiconductor die, wherein said substantially rigid, electrically conductive backing plate covers all of said second surface of said semiconductor die and extends laterally beyond a periphery of said semiconductor die, said substantially rigid, electrically conductive backing plate having sufficient rigidity to maintain said at least one semiconductor die immovably affixed thereto in alignment with said carrier substrate so that said integrated circuit is in electrical connection with said conductors of said pattern; and
   a conduction element electrically connecting said substantially rigid, electrically conductive backing plate to a conductor of said carrier substrate to effect said voltage level application.

2. The semiconductor device of claim 1, wherein said applied voltage level is selected from the group comprising ground and a reference potential.

3. The semiconductor device of claim 1, wherein said active surface is configured with I/O pads in a pattern alignable with I/O surfaces of said conductors of said carrier substrate for flip-chip conductive bonding thereto.

4. The semiconductor device of claim 1, wherein said conduction element comprises a metal wire bonded to said backing plate and to a conductor of said pattern of conductors on said at least a first surface of said carrier substrate.

5. The semiconductor device of claim 1, wherein said conduction element comprises a conductive polymeric material.

6. The semiconductor device of claim 1, wherein said substantially rigid, electrically conductive backing plate comprises a metallic sheet.

7. The semiconductor device of claim 6, wherein said metallic sheet is carried on a substantially rigid dielectric substrate.

8. The semiconductor device of claim 1, further comprising a TAB lead pattern applied to said active surface and electrically connected between said active surface and conductors of said pattern.

9. A flip-chip semiconductor device component, comprising:
   at least one integrated circuit chip having an active first surface and a second opposed surface, said active first surface configured to electrically connect said at least one integrated circuit chip to conductors of a carrier substrate; and
   a substantially rigid, electrically conductive backing plate immovably affixed and conductively bonded to said second surface of said at least one integrated circuit chip, wherein said substantially rigid, electrically conductive backing plate covers said second surface and extends laterally beyond a periphery of said at least one integrated circuit chip, said substantially rigid, electrically conductive backing plate having sufficient rigidity to maintain a substantially precise location thereon of said at least one integrated circuit chip for positioning of said at least one integrated circuit chip by manipulation of said substantially rigid, electrically conductive backing plate whereby said at least one integrated circuit chip may be substantially precisely aligned with a carrier substrate for affixation thereto.

10. The flip-chip semiconductor device component of claim 9, further comprising conductive bumps carried on said active first surface for bonding to conductors on a carrier substrate surface.

11. The flip-chip semiconductor device component of claim 9, further comprising a pattern of conductive TAB leads applied to said first active surface of said at least one integrated circuit chip.

12. The flip-chip semiconductor device component of claim 9, further comprising a conductive connection member extending from said substantially rigid, electrically conductive backing plate and configured to be conductively connected to a conductor of a carrier substrate.

13. The flip-chip semiconductor device component of claim 12, wherein said conductive connection member comprises a metal wire.

14. The flip-chip semiconductor device component of claim 12, wherein said conductive connection member comprises a conductive TAB lead.

15. The flip-chip semiconductor device component of claim 12, wherein said conductive connection member comprises an electrically conductive polymer material.

16. The flip-chip semiconductor device component of claim 9, wherein said substantially rigid, electrically conductive backing plate includes an integral conductive projection configured for connection to a conductor of a carrier substrate.

17. The flip-chip semiconductor device component of claim 9, wherein said substantially rigid, electrically conductive backing plate is formed of metal.

18. A flip-chip semiconductor device, comprising:
   a carrier substrate having a pattern of conductors for attachment thereto of multiple flip-chip semiconductor dice, said pattern of conductors including a conductor for providing a common potential to said flip-chip semiconductor dice;
   an electrically conductive backing plate sized and configured to be generally coextensive with a plurality of flip-chip dice attached to said pattern of conductors on said carrier substrate;
   a plurality of flip-chip semiconductor dice, each of said plurality of flip-chip semiconductor dice having an active surface facing and conductively joined to said carrier substrate pattern of conductors, and an opposing surface conductively joined to said electrically conductive backing plate, wherein said electrically conductive backing plate covers each opposing surface and extends laterally beyond a periphery of each of said plurality of flip-chip semiconductor dice; and
   a conductive down-bond connector electrically connecting said electrically conductive backing plate to said common potential conductor on said carrier substrate.

19. The flip-chip semiconductor device of claim 18, further comprising machine-recognizable indicia on said electrically conductive backing plate to facilitate automated manipulation thereof.

20. The flip-chip semiconductor device of claim 18, wherein at least one die of said plurality of flip-chip semiconductor dice has a thickness dimension relatively greater than a thickness dimension of at least another die and a first surface of said backing plate includes at least one recess for accommodating said at least one relatively thicker die, said at least one recess having a depth sized to align said active surface of said at least one relatively thicker die coplanarly with an active surface of said at least another die carried by said backing plate.

21. The flip-chip semiconductor device of claim 18, wherein said conductive down-bond connector comprises a metal wire joined by wire-bonding to said electrically conductive backing plate and said ground conductor.

22. The flip-chip semiconductor device of claim 18, wherein said conductive down-bond connector comprises a conductive polymer material.

23. The flip-chip semiconductor device of claim 22, wherein said down-bond connector comprises a metal filled polymer.

24. The flip-chip semiconductor device of claim 22, wherein said conductive polymer material includes an epoxy.

25. The flip-chip semiconductor device of claim 18, wherein said conductive down-bond connector comprises a conductive two-part chemically cured polymeric material.

26. The flip-chip semiconductor device of claim 18, wherein said conductive down-bond connector comprises an integral extension of said electrically conductive backing plate bonded to said ground conductor.

27. The flip-chip semiconductor device of claim 18, wherein said conductive down-bond connector comprises a TAB lead applied to said electrically conductive backing plate.

28. The flip-chip semiconductor device of claim 18, wherein said device comprises is a wafer-scale assembly.

29. The flip-chip semiconductor device component of claim 17, wherein said metal backing plate comprises a metal sheet carried on a substantially rigid dielectric substrate.

30. The flip-chip semiconductor device of claim 18, wherein said electrically conductive backing plate is substantially rigid.

31. The flip-chip semiconductor device of claim 18, wherein said electrically conductive backing plate comprises metal.

32. The flip-chip semiconductor device of claim 31, wherein said electrically conductive backing plate is substantially rigid.

33. The flip-chip semiconductor device of claim 31, wherein said metal is carried on a dielectric substrate.

34. The flip-chip semiconductor device of claim 33, wherein said dielectric substrate is substantially rigid.

* * * * *

UNITED STATES PATENT AND TRADEMARK OFFICE
CERTIFICATE OF CORRECTION

PATENT NO. : 6,144,101
APPLICATION NO. : 08/758931
DATED : November 7, 2000
INVENTOR(S) : Salman Akram It is certified that error appears in the above-identified patent and that said Letters Patent is hereby corrected as shown below:

On the title page:

In ITEM [57] "Abstract", LINE 2 after "on at least one side" delete the comma ","

| | | |
|---|---|---|
| COLUMN 1, | LINE 19, | change "die," to --die-- |
| COLUMN 1, | LINE 31, | change "die" to --dice-- |
| COLUMN 2, | LINE 22, | change "conductivity-" to --conductively- -- |
| COLUMN 2, | LINE 50, | change "are" to --is-- and change "an" to --and-- |
| COLUMN 2, | LINE 66, | change "dice" to --dice,-- |
| COLUMN 3, | LINE 4, | after ""IC"" delete the comma "," |
| COLUMN 3, | LINE 19, | delete "with" |
| COLUMN 3, | LINE 43, | after "with" and before "integral" insert --an-- |
| COLUMN 3, | LINE 47, | after "bonding" delete the comma "," |
| COLUMN 4, | LINE 4, | after "first side 16," delete the comma "," |
| COLUMN 4, | LINE 12, | change "metailization" to --metallization-- |
| COLUMN 4, | LINE 16, | change "conduction pattern 14" to --conductor pattern 14-- |
| COLUMN 4, | LINE 18, | after "solder bumps 26" insert comma --,-- |
| COLUMN 4, | LINE 27, | after "die 20" insert comma --,-- |
| COLUMN 4, | LINE 31, | after "of " delete "an" |
| COLUMN 4, | LINE 36, | change "substrate connection 30" to --reference potential 30-- |
| COLUMN 4, | LINE 58, | after "bond," delete comma "," |
| COLUMN 5, | LINE 17, | change "down-bond 50" to --down-bond connection 50-- |
| COLUMN 5, | LINE 51, | change "plate-mounted" to --flip-chip-- |
| COLUMN 6, | LINE 10, | change "substrate connection 30" to --ground connection 30-- |
| COLUMN 6, | LINE 24, | after "processes," delete comma "," |
| COLUMN 6, | LINE 36, | change "portion 56" to --portion-- |
| COLUMN 6, | LINE 42, | change "enable" to -- enables-- |
| COLUMN 6, | LINES 44, 45 | change "mounted dice flip-chip semiconductor 20" to --mounted flip-chip semiconductor dice 20-- |
| COLUMN 6, | LINES 51, 52, | after "sub-strate." insert --12-- |
| COLUMN 6, | LINE 58, | change "ground or reference potential connection 50" to --down-bond connection 50-- |
| COLUMN 7, | LINE 19, | change "carrier substrate 10" to --carrier substrate 12-- |
| COLUMN 7, | LINE 20, | before "side 16" insert --first-- |
| COLUMN 7, | LINE 36, | after "backing plate" insert --32-- |
| COLUMN 7, | LINE 39, | after "lead 68" insert --broken lines-- |
| COLUMN 7, | LINE 43, | after "polymeric material" delete "32" |

UNITED STATES PATENT AND TRADEMARK OFFICE
CERTIFICATE OF CORRECTION

PATENT NO.        : 6,144,101
APPLICATION NO. : 08/758931
DATED             : November 7, 2000
INVENTOR(S)       : Salman Akram It is certified that error appears in the above-identified patent and that said Letters Patent is hereby corrected as shown below:

|  |  |  |
|---|---|---|
| COLUMN 7, | LINE 56, | change "conductive pattern 14" to --conductor pattern 14-- |
| COLUMN 8, | LINE 11, | after "sheet" insert --136-- |
| COLUMN 8, | LINE 16, | change "dielectric plate 134" to --dielectric plate substrate 134-- |
| COLUMN 8, | LINE 18, | before "plate" insert --backing-- |
| COLUMN 9, | LINE 3, | after "the" and before "disclosed" insert --invention-- |

| | | | |
|---|---|---|---|
| CLAIM 3, | COLUMN 9, | LINE 39, | after "said" and before "conductors" insert --pattern of-- |
| CLAIM 8, | COLUMN 9, | LINE 56, | after "and" and before "con-" insert --said-- |
| CLAIM 10, | COLUMN 10, | LINE 16, | after "surface" insert --of said at least one integrated circuit chip-- |
| CLAIM 11, | COLUMN 10, | LINE 19, | change "first active" to --active first-- |
| CLAIM 20, | COLUMN 11, | LINE 4, | change "said" to --a-- |
| CLAIM 20, | COLUMN 11, | LINE 7, | after "said" and before "backing plate" insert --electrically conductive-- |
| CLAIM 20, | COLUNM 11, | LINE 9, | after "said" and before "active" insert --dice-- |
| CLAIM 20, | COLUMN 11, | LINE 11, | after "said" and before "backing plate" insert --electrically conductive-- |
| CLAIM 21, | COLUMN 11, | LINE 16, | change "ground" to --common potential-- |
| CLAIM 25, | COLUMN 11, | LINE 28, | change "two part" to --,two part,-- |
| CLAIM 26, | COLUMN 12, | LINE 4, | change "ground" to --common potential-- |
| CLAIM 28, | COLUMN 12, | LINE 9, | delete "is" |
| CLAIM 29, | COLUMN 12, | LINE 11, | change "metal" to --substantially rigid, electrically conductive-- |

Signed and Sealed this

Fifteenth Day of August, 2006

JON W. DUDAS
*Director of the United States Patent and Trademark Office*